(12) United States Patent
Takahashi et al.

(10) Patent No.: US 7,232,648 B2
(45) Date of Patent: Jun. 19, 2007

(54) PHOTOSENSITIVE RESIN COMPOSITION AND COATING FILM CURED PRODUCT THEREOF

(75) Inventors: Hideyuki Takahashi, Yokohama (JP); Kenji Ishizeki, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/219,869

(22) Filed: Sep. 7, 2005

(65) Prior Publication Data

US 2006/0003256 A1 Jan. 5, 2006

Related U.S. Application Data

(63) Continuation of application No. PCT/JP2004/002732, filed on Mar. 4, 2004.

(30) Foreign Application Priority Data

| Mar. 7, 2003 | (JP) | ............................ 2003-061813 |
| Nov. 14, 2003 | (JP) | ............................ 2003-385222 |

(51) Int. Cl.
*G03C 1/73* (2006.01)
*G03F 7/032* (2006.01)
*G03F 7/028* (2006.01)

(52) U.S. Cl. .............................. 430/287.1; 430/286.1; 430/907; 430/916; 430/281.1; 430/280.1; 430/9

(58) Field of Classification Search ................. None
See application file for complete search history.

(56) References Cited

U.S. PATENT DOCUMENTS

2005/0191580 A1* 9/2005 Takahashi et al. ........ 430/270.1

FOREIGN PATENT DOCUMENTS

| JP | 4-194941 | 7/1992 |
| JP | 7-35915 | 2/1995 |
| JP | 08-176504 | 7/1996 |
| JP | 11-279243 | 10/1999 |
| JP | 11-281815 | 10/1999 |
| JP | 2000-298339 | 10/2000 |
| JP | 2001-288216 | 10/2001 |

* cited by examiner

*Primary Examiner*—Sin Lee
(74) *Attorney, Agent, or Firm*—Oblon, Spivak, McClelland, Maier & Neustadt, P.C.

(57) ABSTRACT

A photosensitive resin composition comprising a resin (A1) having fluorine atom-containing groups, silicon atom-containing groups and ethylenic double bonds, a radical initiator (B) and an alkali-soluble photosensitive resin (D) having at least three ethylenic double bonds per molecule. Further, a photosensitive resin composition comprising a resin (A2) having fluorine atom-containing groups and ethylenic double bonds, a resin (A3) having silicon atom-containing groups and ethylenic double bonds, a radical initiator (B), and an alkali-soluble photosensitive resin (D) having at least three ethylenic double bonds per molecule.

15 Claims, No Drawings

PHOTOSENSITIVE RESIN COMPOSITION AND COATING FILM CURED PRODUCT THEREOF

TECHNICAL FIELD

The present invention relates to a photosensitive resin composition and a coating film cured product thereof.

BACKGROUND ART

Heretofore, photosensitive resin compositions have been used to prepare masks for production of circuits, such as semiconductor integrated circuits (IC) and thin film transistor (TFT) circuits for liquid crystal displays (LCD), and a photosensitive resin composition capable of forming a finer pattern structure, is required.

On the other hand, a photosensitive resin composition has attracted attention also as a resist material to form ITO electrodes for LCD, an organic EL display, etc., or as a permanent film-forming material for an interlayer insulation film, a circuit-protecting film, a barrier rib material for a color filter, a barrier rib material for an organic EL display, etc. For example, in the production of a color filter, an ink jet method has been proposed wherein ink is applied by ink jet within fine pixels, but formation of a pixel pattern is carried out by photolithography using a photosensitive resin composition, wherein a coating film cured product of the photosensitive resin composition is utilized as barrier ribs between pixels.

In the ink jet method, in order to prevent e.g. color mixing of inks between adjacent pixels, barrier ribs are required to have so-called ink repellency i.e. repellency against the ink solvent such as water or an organic solvent. Further, the barrier ribs are required to have "ink falling property" so that ink sprayed on barrier ribs as slightly deviated from pixels will fall into the desired pixels.

Further, in order to inject plural inks and apply them separately in each pixel, barrier ribs are required to have "durability of ink repellency/ink falling property" i.e. a nature to maintain ink repellency and ink falling property even after applying one ink solvent.

Further, after forming barrier ribs for a pixel pattern via a photolithography step by applying a photosensitive resin composition, stain on the substrate surface in pixels may sometimes be removed before injecting inks. For example, a step of cleaning the substrate surface by e.g. irradiation with a low pressure mercury lamp or with ultraviolet rays such as excimer UV, or by photo-ashing treatment (hereinafter referred to as a cleaning step) may be mentioned. Barrier ribs are required to have a nature to maintain the ink repellency and ink falling property even after such a cleaning step, i.e. "ink repellency/ink falling property after UV irradiation".

JP-A-8-176504 (claim 1) discloses a coating agent which comprises a copolymer (component 1) having (meth)acryloyl groups, of a structure wherein an isocyanate group of an isocyanate group- and (meth)acryloyl group-containing monomer is addition-reacted with hydroxyl groups of a polymer obtained by reacting a perfluoroalkyl group-containing α,β-unsaturated monomer, a polysiloxane chain-containing α,β-unsaturated monomer and a hydroxyl group-containing α,β-unsaturated monomer as essential components, and a hydrocarbon type monomer (component 2) containing either a (meth)acryloyl group or a vinyl group in its molecule.

JP-A-11-279243 (claim 4, paragraph 0035) discloses a composition which comprises an ultraviolet-curable resin (component 3) formed from a copolymer of an unsaturated monomer component containing an ethylenically unsaturated monomer having silicon atoms and having at least two ethylenically unsaturated groups, carboxyl groups and silicon atoms per molecule, an epoxy compound (component 4) having at least two epoxy groups per molecule, a photopolymerization initiator (component 5), a diluting agent (component 6) and a leveling agent (component 7) such as a fluorine type surfactant.

However, with the hydrocarbon type monomer in the coating agent disclosed in JP-A-8-176504 (claim 1), it has been difficult to have a difference in alkali solubility between an exposed portion and a non-exposed portion, and from such a coating agent, it has been difficult to form a fine pattern. On the other hand, the leveling agent such as a fluorine type surfactant disclosed in JP-A-11-279243 (claim 4, paragraph 0035), has no photosensitive group, and such a composition was inadequate in the durability of ink repellency.

DISCLOSURE OF THE INVENTION

It is an object of the present invention to provide a photosensitive resin composition which is capable of forming a coating film cured product excellent in ink repellency, ink falling property, durability thereof and adhesion to the substrate and which is further capable of forming a fine pattern.

The present invention provides the following means.

First Photosensitive Resin Composition

A photosensitive resin composition comprising a resin (A1), a radical initiator (B) and an alkali-soluble photosensitive resin (D), wherein the resin (A1) and the alkali-soluble photosensitive resin (D) are as follows:

The resin (A1) has groups (a) of the following formula 1, groups (b) of the following formula 2 and ethylenic double bonds (d):

   Formula 1

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom))

   Formula 2

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.)

The alkali-soluble photosensitive resin (D) has acidic groups (c) and at least three ethylenic double bonds (d) per molecule, and does not have groups (a) of the above formula 1 or groups (b) of the above formula 2.

Second Photosensitive Resin Composition

A photosensitive resin composition comprising a resin (A2), a resin (A3), a radical initiator (B) and an alkali-soluble photosensitive resin (D), wherein the resin (A2), the resin (A3) and the alkali-soluble photosensitive resin (D) are as follows:

The resin (A2) has groups (a) of the following formula 1 and ethylenic double bonds (d) and does not have groups (b) of the following formula 2;

The resin (A3) has groups (b) of the following formula 2 and ethylenic double bonds (d) and does not have groups (a) of the following formula 1:

$$—CFXR^f \qquad \text{Formula 1}$$

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom.))

$$—(SiR^1R^2—O)_n—SiR^1R^2R^3 \qquad \text{Formula 2}$$

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.)

The alkali-soluble photosensitive resin (D) has acidic groups (c) and at least three ethylenic double bonds (d) per molecule and does not have groups (a) of the above formula 1 or groups (b) of the above formula 2.

The resin (A1) will impart ink repellency and ink falling property to a coating film cured product to be formed from the first photosensitive resin composition of the present invention. The resin (A2) and the resin (A3) will impart ink repellency and ink falling property to a coating film cured product to be formed from the second photosensitive resin composition of the present invention.

The groups (a) of the formula 1 in the resin (A1) or the resin (A2) will mainly impart ink repellency to a coating film cured product to be formed.

The groups (b) of the formula (2) in the resin (A1) or the resin (A3) will mainly impart excellent ink falling property for an ink having a high polarity to a coating film cured product. Further, resistance against UV irradiation is relatively low with the groups (a) of the formula 1, but is excellent with the groups (b) of the formula 2. Accordingly, by the presence of the groups (b) of the formula 2, it is possible to suppress deterioration of the groups (a) by UV irradiation and to maintain the ink repellency after UV irradiation.

The resin (A1), (A2) or (A3) has ethylenic double bonds (d). Accordingly, by irradiation with light, the resin (A1), (A2) or (A3) will be bonded by covalent bonding to another constituting component of the photosensitive resin composition and will be fixed to the coating film cured product, whereby durability of the ink repellency and durability of ink falling property will be high.

The groups (a) of the formula 1 or the groups (b) of the formula 2 have surface migration characteristics, whereby at the time of prebaking (drying of the coating film), the resin (A1), (A2) or (A3) will move to the vicinity of the coating film surface at the interface with air. Accordingly, even by an addition of a small amount of the resin, sufficient ink repellency and ink falling property can be imparted to the surface of the coating film cured product.

Further, by the migration of the resin (A1), (A2) or (A3) to the vicinity of the coating film surface at the interface with air at the time of prebaking, the concentration of the resin (A1), (A2) or (A3) in the vicinity of the substrate will relatively decrease, whereby it is possible to prevent deterioration in the adhesion of the coating film cured product to the substrate.

The alkali-soluble photosensitive resin (D) primarily imparts the developability to the photosensitive resin and has at least three ethylenic double bonds per molecule, whereby a difference in the alkali solubility between an exposed portion and a non-exposed portion can easily be obtained, and it makes it possible to form a fine pattern with less exposure.

According to the present invention, it is possible to obtain a photosensitive resin composition which is capable of forming a coating film cured product excellent in ink repellency, ink falling property, durability thereof and adhesion to the substrate and which is further capable of forming a fine pattern.

BEST MODE FOR CARRYING OUT THE INVENTION

In the compound names in this specification, "(meth)acrylate" means an acrylate and/or a methacrylate. Likewise, "(meth)acrylic acid" means acrylic acid and/or methacrylic acid, and "(meth)acrylamide" means acrylamide and/or methacrylamide.

In this specification, "%" represents "mass %", unless otherwise specified.

Now, the resin (A1) to be used in the first photosensitive resin composition of the present invention will be described.

The resin (A1) has groups (a) of the following formula 1, groups (b) of the following formula 2 and ethylenic double bonds (d).

$$—CFXR^f \qquad \text{Formula 1}$$

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom))

$$—(SiR^1R^2—O)_n—SiR^1R^2R^3 \qquad \text{Formula 2}$$

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.)

In a case where $R^f$ in the groups (a) of the formula 1 is an alkyl group having at most 20 carbon atoms wherein at least one of hydrogen atoms is substituted by a fluorine atom, such an alkyl group may contain hydrogen atoms substituted by halogen atoms other than fluorine atoms, and as such other halogen atoms, chlorine atoms are preferred. Further, an etheric oxygen atom may be present between a carbon-carbon bond in the alkyl group, or may be present at a bond terminal.

Specific examples of the group (a) of the formula 1 include $—CF_3$, $—CF_2CF_3—$, $—CF_2CHF_2$, $—(CF_2)_2CF_3$, $—(CF_2)_3CF_3$, $—(CF_2)_4CF_3$, $—(CF_2)_5CF_3$, $—(CF_2)_6CF_3$, $—(CF_2)_7CF_3$, $—(CF_2)_8CF_3$, $—(CF_2)_9CF_3$, $—(CF_2)_{11}CF_3$, $—(CF_2)_{15}CF_3$, $—CF_2O(CF_2CF_2O)_pCF_3$ (p is from 0 to 8), $—CF(CF_3)O(CF_2CF(CF_3)O)_p(CF_2)_5CF_3$ (p is from 0 to 4), and $—CF(CF_3)O(CF_2CF(CF_3)O)_p(CF_2)_2CF_3$ (p is from 0 to 5).

The group (a) of the formula 1 is preferably a perfluoroalkyl group or a polyfluoroalkyl group containing one hydrogen atom, particularly preferably a perfluoroalkyl group (provided that such an alkyl group includes one having an etheric oxygen atom). The resin (A1) will thereby exhibit good ink repellency. The total carbon number in the group (a) of the formula 1 is preferably at most 15, whereby the resin (A1) exhibits good ink repellency, particularly good organic solvent repellency. Further, in a case where the resin (A1) of the present invention is prepared by copolymerization of a monomer having a group (a) of the formula 1 with another monomer as a copolymerizable component, the compatibility of the two monomers will be good.

In the formula 2, $R^1$ and $R^2$ may be the same or different in every siloxane unit. So that the resin (A1) will exhibits an excellent ink falling property, each of $R^1$ and $R^2$ is preferably a hydrogen atom, a $C_{1-10}$ alkyl group, a cycloalkyl group or an aryl group, more preferably a hydrogen atom, a methyl group or a phenyl group, and particularly preferably, each of $R^1$ and $R^2$ in all siloxane units is a methyl group. Further, when $R^3$ is an organic group, such an organic group may contain a nitrogen atom, an oxygen atom or the like. $R^3$ is preferably a hydrogen atom or a $C_{1-5}$ hydrocarbon group. Further, n is preferably an integer of from 1 to 100.

The ethylenic double bond (d) may, for example, be an addition polymerizable unsaturated group such as an acryl group, an allyl group, a vinyl group or a vinyl ether group. Some or all of hydrogen atoms in such a group may be substituted by a hydrocarbon group. As such a hydrocarbon group, a methyl group is preferred.

The resin (A1) preferably has acidic groups (c), whereby the developability of the photosensitive resin composition will be good, and it becomes possible to form a finer pattern.

The acidic group (c) may, for example, be at least one acidic group selected from the group consisting of a carboxyl group, a sulfonic group and a phenolic hydroxyl group, or a salt thereof.

The resin (A1) is preferably a polymer obtained by reacting a compound having an ethylenic double bond (d) to reactive sites of a polymer obtained by copolymerizing a monomer having a group (a) of the formula 1, a monomer having a group (b) of the formula 2 and a monomer having a reactive site (preferably a monomer having an acidic group (c)).

The monomer having a group (a) of the formula 1 may, for example, be

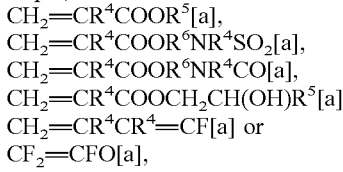

$CH_2=CR^4COOR^5[a]$,
$CH_2=CR^4COOR^6NR^4SO_2[a]$,
$CH_2=CR^4COOR^6NR^4CO[a]$,
$CH_2=CR^4COOCH_2CH(OH)R^5[a]$
$CH_2=CR^4CR^4=CF[a]$ or
$CF_2=CFO[a]$, wherein $R^4$ is a hydrogen atom or a methyl group, $R^5$ is a single bond or a $C_{1-6}$ bivalent organic group, $R^6$ is a $C_{1-6}$ bivalent organic group, and [a] represents a group (a) of the formula 1.

Specific examples of $R^5$ or $R^6$ include $CH_2$, $CH_2CH_2$, $CH(CH_3)$, $CH_2CH_2CH_2$, $C(CH_3)_2$, $CH(CH_2CH_3)$, $CH_2CH_2CH_2CH_2$, $CH(CH_2CH_2CH_3)$, $CH_2(CH_3)_3CH_2$, and $CH(CH_2CH(CH_3)_2)$. $R^5$ may be single bond.

A monomer having a group (a) of the formula 1 may be used alone, or at least two types of such a monomer may be used in combination.

The monomer having a group (b) of the formula 2 may, for example, be $CH_2=CHCOOR^7[b]$ or $CH_2=C(CH_3)COOR^7[b]$, wherein $R^7$ is a single bond or a $C_{1-6}$ bivalent organic group, and [b] represents a group (b) of the formula 2.

Specific examples of $R^7$ include a single bond, $CH_2$, $CH_2CH_2$, $CH(CH_3)$, $CH_2CH_2CH_2$, $C(CH_3)_2$, $CH(CH_2CH_3)$, $CH_2CH_2CH_2CH_2$, $CH(CH_2CH_2CH_3)$, $CH_2(CH_2)_3CH_2$, and $CH(CH_2CH(CH_3)_2)$.

The monomer having a group (b) of the formula 2 may be used alone, or at least two types of such a monomer may be used in combination.

Among monomers having an acidic group (c), a monomer having a carboxyl group may, for example, be acrylic acid, methacrylic acid, vinyl acetic acid, crotonic acid, itaconic acid, maleic acid, fumaric acid, cinnamic acid or salts thereof.

The monomer having a sulfonic group may, for example, be a vinyl sulfonic acid, styrenesulfonic acid, (meth)allylsulfonic acid, 2-hydroxy-3-(meth)allyloxypropanesulfonic acid, (meth)acrylic acid-2-sulfoethyl, (meth)acrylic acid-2-sulfopropyl, 2-hydroxy-3-(meth)acryloxypropanesulfonic acid, 2-(meth)acrylamide-2-methylpropanesulfonic acid, or salts thereof.

The monomer having a phenolic hydroxyl group may, for example, be o-hydroxystyrene, m-hydroxystyrene or p-hydroxystyrene. Further, it may be a compound wherein at least one hydrogen atom in such a benzene ring is substituted by an alkyl group such as methyl, ethyl or n-butyl, an alkoxy group such as methoxy, ethoxy or n-butoxy, a halogen atom, a haloalkyl group having at least one hydrogen atom of an alkyl group substituted by a halogen atom, a nitro group, a cyano group or an amide group.

The monomer having a reactive site may, for example, be a monomer having a hydroxyl group, an acid anhydride having an ethylenic double bond, a monomer having a carboxyl group or a monomer having an epoxy group.

The method for introducing an ethylenic double bond (d) into the resin (A1) may, for example, be:

(1) a method wherein a monomer having a hydroxyl group is preliminarily copolymerized, followed by reacting an acid anhydride having an ethylenic double bond (d), (2) a method wherein a monomer having a hydroxyl group is preliminarily copolymerized, followed by reacting a monomer having an isocyanate group, (3) a method wherein a monomer having a hydroxyl group is preliminarily copolymerized, followed by reacting a monomer having an acyl chloride group, (4) a method wherein an acid anhydride having an ethylenic double bond is preliminarily copolymerized, followed by reacting a monomer having a hydroxyl group, (5) a method wherein a monomer having a carboxyl group is preliminarily copolymerized, followed by reacting a monomer having an epoxy group, or (6) a method wherein a monomer having an epoxy group is preliminarily copolymerized, followed by reacting a monomer having a carboxyl group.

The resin (A1) may have monomer units based on monomers (other monomers) other than the monomer having a group (a) of the formula 1, the monomer having a group (b) of the formula 2 and the monomer having an acidic group (c).

Such other monomers may, for example, be hydrocarbon type olefins, vinyl ethers, isopropenyl ethers, allyl ethers, vinyl esters, allyl esters, (meth)acrylic acid esters, (meth) acrylamides, aromatic vinyl compounds, chloroolefins or conjugated dienes. These compounds may contain a functional group, such as a hydroxyl group, a carbonyl group or an alkoxy group. Particularly preferred are (meth)acrylic acid esters or (meth)acrylamides, since coating films formed from such photosensitive resin compositions will be excellent in heat resistance.

Other than copolymerizing the monomer having a group (a) of the formula 1 with the monomer having a group (b) of the formula 2, the resin (A1) may be produced by various modification methods in which a compound having a group (a) of the formula 1 is reacted to reactive sites of a polymer having such reactive sites, to introduce the group (a) of the formula 1.

Such various modification methods may, for example, be:

(1) a method wherein a monomer having an epoxy group is preliminarily copolymerized, followed by reacting a compound having either a carboxyl group, an amino group or a mercapto group at one terminal and a group (a) at another terminal, (2) a method wherein a monomer having an amino group is preliminarily copolymerized, followed by reacting a compound having a carboxyl group or an epoxy group at one terminal and a group (a) at another terminal, (3) a method wherein a monomer having a carboxyl group is preliminarily copolymerized, followed by reacting a compound having either an epoxy group, an amino group or a silyl chloride group at one terminal and a group (a) at another terminal, and (4) a method wherein a monomer having a hydroxyl group is preliminarily copolymerized, followed by reacting a compound having a silyl chloride group at one terminal and a group (a) at another terminal.

Other than copolymerizing the monomer having a group (b) of the formula 2 with the monomer having a group (a) of the formula 1, the resin (A1) may be produced by various modification methods wherein a compound having a group (b) of the formula 2 is reacted to reactive sites of a polymer having such reactive sites, to introduce the group (b) of the formula 2.

Such various modification methods wherein the compound having a group (b) of the formula 2 is reacted to the polymer having reactive sites, are similar to the various modification methods described above with respect to the introduction of the group (a) of the formula 1.

Other than copolymerizing the monomer having an acidic group (c) with the monomer having a group (a) of the formula 1 and the monomer having a group (b) of the formula 2, the resin (A1) may, for example, be produced by (1) a method wherein a monomer having a hydroxyl group is preliminarily copolymerized, followed by reacting an acid anhydride, or (2) a method wherein an acid anhydride having an ethylenic double bond is preliminarily copolymerized, followed by reacting a compound having a hydroxyl group, to introduce a carboxyl group as the acidic group (c).

The resin (A1) may also be produced by a method of using a polymerization initiator having a group (a) of the formula 1, or a method of using a polymerization initiator having a group (b) of the formula 2.

The polymerization initiator having a group (b) of the formula 2 may contain a group having a bivalent polysiloxane structure in the main chain of the initiator molecule, or may contain a group having a monovalent polysiloxane structure at a terminal portion or in a side chain of the initiator molecule. The initiator containing a group having a bivalent polysiloxane structure in the main chain of the initiator molecule, may, for example, be a compound which alternately have a group having a bivalent polysiloxane structure and an azo group. As a commercial product, VPS-1001 or VPS-0501 (manufactured by Wako Pure Chemical Industries, Ltd.) may be mentioned.

The resin (A1) may be prepared, for example, by a method wherein the respective monomers are dissolved in a solvent and reacted by adding a polymerization initiator and, if necessary, under heating. The reaction is preferably carried out in the presence of a chain transfer agent, as the case requires. The monomers, the polymerization initiator, the solvent and the chain transfer agent may be continuously added.

The fluorine atom content in the resin (A1) is preferably from 1 to 30%, more preferably from 3 to 25%. Within this range, the resin (A1) will be excellent in the effect to lower the surface tension of a coating film cured product to be formed and will impart high ink repellency to the coating film cured product. Further, the coating film will be free from turbidity, the developability of the photosensitive resin composition will be excellent, and the adhesion of the coating film cured product to the substrate will be high.

The content of silicon atoms in the resin (A1) is preferably from 0.1 to 25%, more preferably from 0.5 to 20%. Within this range, the resin (A1) will impart a good ink falling property to the coating film cured product, and the developability of the photosensitive resin composition will be good.

The resin (A1) preferably has from 3 to 100 ethylenic double bonds per molecule. More preferred is from 5 to 40. Within this range, the developability of the photosensitive resin composition will be good.

The acid value of the resin (A1) is preferably from 10 to 200 (mgKOH/g), more preferably from 20 to 130 (mgKOH/g). Within this range, the alkali solubility of the resin (A1), and the developability of the photosensitive resin composition will be good.

In the resin (A1), the proportion of other polymerized units is preferably at most 90%, more preferably at most 70%. Within this range, the developability of the photosensitive resin composition will be good.

The number average molecular weight of the resin (A1) is preferably at least 1,000 and less than 20,000, more preferably at least 2,000 and less than 12,000. Within this range, the change in contrast by exposure will be large, and the sensitivity to light will be high, and on the other hand, there will be a merit such that the solubility in the developing solution will be high, and it will be possible to prevent formation of a dissolution residue at the non-exposed portion.

The proportion of the resin (A1) in the total solid content of the photosensitive resin composition is preferably from 0.01 to 50%, more preferably from 0.05 to 30%, particularly preferably from 0.05 to 20%. Within this range, the developability of the photosensitive resin composition will be good, the coating film cured product to be formed will exhibit good ink repellency and ink falling property, and the adhesion of the coating film cured product to the substrate will be good.

Now, the resin (A2) and the resin (A3) to be used in the second photosensitive resin composition of the present invention will be described.

The resin (A2) has groups (a) of the following formula 1 and ethylenic double bonds (d) and do not have groups (b) of the following formula 2.

The resin (A3) has groups (b) of the following formula 2 and ethylenic double bonds (d), and does not have groups (a) of the following formula 1.

$$-CFXR^f \qquad \text{Formula 1}$$

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom))

$$-(SiR^1R^2-O)_n-SiR^1R^2R^3 \qquad \text{Formula 2}$$

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200.)

In a case where $R^f$ in the group (a) of the formula 1 is an alkyl group having at most 20 carbon atoms wherein at least one of hydrogen atoms is substituted by a fluorine atom, such an alkyl group may contain hydrogen atoms substituted by halogen atoms other than fluorine atoms, and as such other halogen atoms, chlorine atoms are preferred. Further, an etheric oxygen atom may be present between a carbon-carbon bond in the alkyl group, or may be present at a bond terminal.

Specific examples of the group (a) of the formula 1 includes $-CF_3$, $-CF_2CF_3-$, $-CF_2CHF_2$, $-(CF_2)_2CF_3$, $-(CF_2)_3CF_3$, $-(CF_2)_4CF_3$, $-(CF_2)_5CF_3$, $-(CF_2)_6CF_3$, $-(CF_2)_7CF_3$, $-(CF_2)_8CF_3$, $-(CF_2)_9CF_3$, $-(CF_2)_{11}CF_3$, $-(CF_2)_{15}CF_3$, $-CF_2O(CF_2CF_2O)_pCF_3$ (p is from 0 to 8), $-CF(CF_3)O(CF_2CF(CF_3)O)_p(CF_2)_5CF_3$ (p is from 0 to 4), and $-CF(CF_3)O(CF_2CF(CF_3)O)_p(CF_2)_2CF_3$ (p is from 0 to 5).

The group (a) of the formula 1 is preferably a perfluoroalkyl group or a polyfluoroalkyl group containing one hydrogen atom, particularly preferably a perfluoroalkyl group (provided that such an alkyl group includes one having an etheric oxygen atom). The resin (A2) will thereby exhibit good ink repellency. The total carbon number in the group (a) of the formula 1 is preferably at most 15, whereby the resin (A2) exhibits good ink repellency, particularly good organic solvent repellency. Further, in a case where the resin (A2) of the present invention is prepared by copolymerization of a monomer having a group (a) of the formula 1 with another monomer as a copolymerizable component, the compatibility of the two monomers will be good.

In the formula 2, $R^1$ and $R^2$ may be the same or different in every siloxane unit. So that the resin (A1) will exhibits an excellent ink falling property, each of $R^1$ and $R^2$ is preferably a hydrogen atom, a $C_{1-10}$ alkyl group, a cycloalkyl group or an aryl group, more preferably a hydrogen atom, a methyl group or a phenyl group, and particularly preferably, each of $R^1$ and $R^2$ in all siloxane units is a methyl group. Further, when $R^3$ is an organic group, such an organic group may contain a nitrogen atom, an oxygen atom or the like. $R^3$ is preferably a hydrogen atom or a $C_{1-5}$ hydrocarbon group. Further, n is preferably an integer of from 1 to 100.

The ethylenic double bond (d) may, for example, be an addition polymerizable unsaturated group such as an acryl group, an allyl group, a vinyl group or a vinyl ether group. Some or all of hydrogen atoms in such a group may be substituted by a hydrocarbon group. As such a hydrocarbon group, a methyl group is preferred.

The resin (A2) or the resin (A3) preferably has acidic groups (c), whereby the developability of the photosensitive resin composition will be good, and it becomes possible to form a finer pattern.

The acidic group (c) may, for example, be at least one acidic group selected from the group consisting of a carboxyl group, a sulfonic group and a phenolic hydroxyl group, or a salt thereof.

The resin (A2) is preferably a polymer obtained by reacting a compound having an ethylenic double bond (d) to reactive sites of a polymer obtained by copolymerizing a monomer having a group (a) of the formula 1 with a monomer having a reactive site (preferably a monomer having an acidic group (c)). Likewise, the resin (A3) is preferably a polymer obtained by reacting a compound having an ethylenic double bond (d) to reactive sites of a polymer obtained by copolymerizing a monomer having a group (b) of the formula 2 with a monomer having a reactive site (preferably a monomer having an acidic group (c)).

The monomer having a group (a) of the formula 1 may, for example, be $CH_2=CR^4COOR^5$[a],
$CH_2=CR^4COOR^6NR^4SO_2$[a],
$CH_2=CR^4COOR^6NR^4CO$[a],
$CH_2=CR^4COOCH_2CH(OH)R^5$[a]
$CH_2=CR^4CR^4=CF$[a] or
$CF_2=CFO$[a],

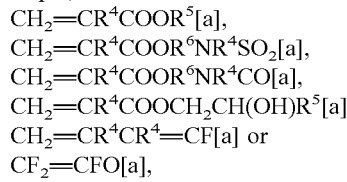

wherein $R^4$ is a hydrogen atom or a methyl group, $R^5$ is a single bond or a $C_{1-6}$ bivalent organic group, $R^6$ is a $C_{1-6}$ bivalent organic group, and [a] represents a group (a) of the formula 1.

Specific examples of $R^5$ or $R^6$ include $CH_2$, $CH_2CH_2$, $CH(CH_3)$, $CH_2CH_2CH_2$, $C(CH_3)_2$, $CH(CH_2CH_3)$, $CH_2CH_2CH_2CH_2$, $CH(CH_2CH_2CH_3)$, $CH_2(CH_3)_3CH_2$, and $CH(CH_2CH(CH_3)_2)$. $R^5$ may be single bond.

A monomer having a group (a) of the formula 1 may be used alone, or at least two types of such a monomer may be used in combination.

The monomer having a group (b) of the formula 2 may, for example, be $CH_2=CHCOOR^7$[b] of $CH_2=C(CH_3)COOR^7$[b], wherein $R^7$ is a single bond or a $C_{1-6}$ bivalent organic group, and [b] represents a group (b) of the formula 2.

Specific examples of $R^7$ include a single bond, $CH_2$, $CH_2CH_2$, $CH(CH_3)$, $CH_2CH_2CH_2$, $C(CH_3)_2$, $CH(CH_2CH_3)$, $CH_2CH_2CH_2CH_2$, $CH(CH_2CH_2CH_3)$, $CH_2(CH_2)_3CH_2$, and $CH(CH_2CH(CH_3)_2)$ The monomer having a group (b) of the formula 2 may be used alone, or at least two types of such a monomer may be used in combination.

Among monomers having an acidic group (c), a monomer having a carboxyl group may, for example, be acrylic acid, methacrylic acid, vinyl acetic acid, crotonic acid, itaconic acid, maleic acid, fumaric acid, cinnamic acid or salts thereof.

The monomer having a sulfonic group may, for example, be a vinyl sulfonic acid, styrenesulfonic acid, (meth)allylsulfonic acid, 2-hydroxy-3-(meth)allyloxypropanesulfonic acid, (meth)acrylic acid-2-sulfoethyl, (meth)acrylic acid-2-sulfopropyl, 2-hydroxy-3-(meth)acryloxypropanesulfonic acid, 2-(meth)acrylamide-2-methylpropanesulfonic acid, or salts thereof.

The monomer having a phenolic hydroxyl group may, for example, be o-hydroxystyrene, m-hydroxystyrene or p-hydroxystyrene. Further, it may be a compound wherein at least one hydrogen atom in such a benzene ring is substituted by an alkyl group such as methyl, ethyl or n-butyl, an alkoxy group such as methoxy, ethoxy or n-butoxy, a halogen atom, a haloalkyl group having at least one hydrogen atom of an alkyl group substituted by a halogen atom, a nitro group, a cyano group or an amide group.

The monomer having a reactive site may, for example, be a monomer having a hydroxyl group, an acid anhydride having an ethylenic double bond, a monomer having a carboxyl group or a monomer having an epoxy group.

The method for introducing an ethylenic double bond (d) into the resin (A2) or the resin (A3) may, for example, be:

(1) a method wherein a monomer having a hydroxyl group is preliminarily copolymerized, followed by reacting an acid anhydride having an ethylenic double bond (d), (2) a method wherein a monomer having a hydroxyl group is preliminarily copolymerized, followed by reacting a monomer having an isocyanate group, (3) a method wherein a monomer having a hydroxyl group is preliminarily copolymerized, followed by reacting a monomer having an acyl chloride group, (4) a method wherein an acid anhydride having an ethylenic double bond is preliminarily copolymerized, followed by reacting a monomer having a hydroxyl group, (5) a method wherein a monomer having a carboxyl group is preliminarily copolymerized, followed by reacting a monomer having an epoxy group, or (6) a method wherein a monomer having an epoxy group is preliminarily copolymerized, followed by reacting a monomer having a carboxyl group.

The resin (A2) or the resin (A3) may have monomer units based on monomers (other monomers) other than the monomer having a group (a) of the formula 1, the monomer having a group (b) of the formula 2 and the monomer having an acidic group (c).

Such other monomers may, for example, be hydrocarbon type olefins, vinyl ethers, isopropenyl ethers, allyl ethers, vinyl esters, allyl esters, (meth)acrylic acid esters, (meth) acrylamides, aromatic vinyl compounds, chloroolefins or conjugated dienes. These compounds may contain a functional group, such as a hydroxyl group, a carbonyl group or an alkoxy group. Particularly preferred are (meth)acrylic acid esters or (meth)acrylamides, since coating films formed from such photosensitive resin compositions will be excellent in heat resistance.

The resin (A2) or the resin (A3) may be prepared, for example, by a method wherein the respective monomers are dissolved in a solvent and reacted by adding a polymerization initiator and, if necessary, under heating. The reaction is preferably carried out in the presence of a chain transfer agent, as the case requires. The monomers, the polymerization initiator, the solvent and the chain transfer agent may be continuously added.

The fluorine atom content in the resin (A2) is preferably from 5 to 30%, more preferably from 10 to 25%. Within this range, the resin (A2) will be excellent in the effect to lower the surface tension of a coating film cured product to be formed and will impart high ink repellency to the coating film cured product. Further, the coating film will be free from turbidity, the developability of the photosensitive resin composition will be excellent, and the adhesion of the coating film cured product to the substrate will be high.

The content of silicon atoms in the resin (A3) is preferably from 0.1 to 30%, more preferably from 0.5 to 25%. Within this range, the resin (A3) will impart a good ink falling property to the coating film cured product, and the developability of the photosensitive resin composition will be good.

The resin (A2) or the resin (A3) preferably has from 3 to 100 ethylenic double bonds per molecule. More preferred is from 5 to 40. Within this range, the developability of the photosensitive resin composition will be good.

The acid value of the resin (A2) or the resin (A3) is preferably from 10 to 200 (mgKOH/g), more preferably from 20 to 130 (mgKOH/g). Within this range, the alkali solubility of the resin (A2) or the resin (A3), and the developability of the photosensitive resin composition will be good.

In the resin (A2) or the resin (A3), the proportion of other polymerized units is preferably at most 90%, more preferably at most 70%. Within this range, the developability of the photosensitive resin composition will be good.

The number average molecular weight of the resin (A2) or the resin (A3) is preferably at least 1,000 and less than 20,000, more preferably at least 2,000 and less than 12,000. Within this range, the change in contrast by exposure will be large, and the sensitivity to light will be high, and on the other hand, there will be a merit such that the solubility in the developing solution will be high, and it will be possible to prevent formation of a dissolution residue at the non-exposed portion.

The proportion of the resin (A2) or the resin (A3) in the total solid content of the photosensitive resin composition is preferably from 0.01 to 20%, more preferably from 0.1 to 10%. Within this range, the developability of the photosensitive resin composition will be good, the coating film cured product to be formed will exhibit good ink repellency and ink falling property, and the adhesion of the coating film cured product to the substrate will be good.

Now, the radical initiator (B) will be described. The radical initiator (B) is a compound which generates radicals under irradiation with light.

The radical initiator (B) may, for example, be an α-diketone such as benzyl, diacetyl, methylphenyl glyoxylate or 9,10-phenanthrenequinone, an acyloin such as benzoin, an acyloin ether such as benzoin methyl ether, benzoin ethyl ether or benzoin isopropyl ether, a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid, a benzophenone such as benzophenone, 4,4'-bis(dimethylamino) benzophenone or 4,4'-bis(diethylamino)benzophenone, an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl[4-(methylthio)phenyl]-2-morpholino-1-propanone, or 2-benzyl-2-dimethylamino-1-(4-morpholinophenyl)-butan-1-one, a quinone such as anthraquinone, 2-ethylanthraquinone, camphorquinone or 1,4-naphthoquinone, an aminobenzoate such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate, a halogenated compound such as phenacyl chloride or trihalomethylphenylsulfone, an acylphosphine oxide, or a peroxide such as di-t-butylperoxide.

Particularly, the above-mentioned aminobenzoate, the above-mentioned benzophenone or the like may sometimes exhibit a sensitizing effect when used in combination with another radical initiator. Further, an aliphatic amine such as triethanolamine, methyldiethanolamine, triisopropanolamine, n-butylamine, N-methyldiethanolamine or diethylaminoethyl methacrylate may also sometimes exhibit a sensitizing effect when used in combination with a radical initiator.

The proportion of the radical initiator (B) in the total solid content of the photosensitive resin composition is preferably from 0.1 to 50%, more preferably from 0.5 to 30%. Within this range, the developability is good.

Now, the alkali-soluble photosensitive resin (D) will be described. The alkali-soluble photosensitive resin (D) has acidic groups (c) and at least three ethylenic double bonds (d) per molecule and does not have groups (a) of the above formula 1 and groups (b) of the above formula 2.

The alkali-soluble photosensitive resin (D) will improve the developability of the photosensitive resin composition and the adhesion of the coating film cured product formed from the photosensitive resin composition, to the substrate.

'The acidic group (c) and the ethylenic double bond (d) are the same as described with respect to the resin (A1) or the resin (A2).

The alkali-soluble photosensitive resin (D) may, for example, be a polymer (D1) obtained by reacting a compound having an ethylenic double bond (d) to reactive sites of a polymer obtained by copolymerizing a monomer having an acidic group (c) with a monomer having a reactive site, or a novolak resin (D2) having ethylenic double bonds (d) introduced.

The above polymer (D1) can be obtained by the same types of monomers and process as described with respect to the resin (A1) or the resin (A2). The polymer (D1) may have polymer units based on a monomer (another monomer) other than the monomer having an acidic group (c) or the monomer having a reactive site. The types of such another monomer may be the same as described with respect to the resin (A1) or the resin (A2).

Now, the novolak resin (D2) having ethylenic double bonds (d) introduced, will be described.

A novolak resin is one obtainable by polycondensation of a phenol with an aldehyde, and it may, for example, be a phenol/formaldehyde resin, a cresol/formaldehyde resin, a phenol/cresol/formaldehyde co-condensed resin. Particularly, a photosensitive resin obtained from a cresol/formaldehyde resin is preferred, since the wettability of the substrate surface to ink after removing a non-exposed portion by development, is good.

The method for introducing an ethylenic double bond (d) to the above novolak resin, may, for example, be (1) a method of reacting some of phenolic hydroxyl groups with a monomer having an epoxy group, (2) a method of reacting some or all of phenolic hydroxyl groups with epichlorohydrin to introduce epoxy groups to the novolak resin, and then reacting the epoxy groups with a monomer having a carboxyl group. Further, hydroxyl groups formed by this reaction may be reacted with an acid anhydride to further introduce carboxyl groups into the molecule.

Commercial products of the novolak resin (D2) having ethylenic double bonds (d) introduced may, for example, be KAYARAD PCT-1069, K-48C, CCR-1105, CCR-1115, TCR-1025, TCR-1064, TCR-1286, ZFR-1122, ZFR-1124 and ZFR-1185 (all manufactured by Nippon Kayaku Co., Ltd.).

The alkali-soluble photosensitive resin (D) has at lest three ethylenic double bonds per molecule, whereby a difference in alkali solubility between an exposed portion and a non-exposed portion can easily be obtained, and it becomes possible to form a fine pattern with less exposure. The number of ethylenic double bonds per molecule is preferably at least 6.

The acid value of the alkali-soluble photosensitive resin (D) is preferably from 10 to 400 (mgKOH/g), more preferably from 50 to 300 (mgKOH/g). Within this range, the alkali solubility and the developability will be good.

The number average molecular weight of the alkali-soluble photosensitive resin (D) is preferably at least 500 and less than 20,000, more preferably at least 2,000 and less than 15,000. Within this range, the alkali solubility and the developability will be good.

The proportion of the alkali-soluble photosensitive resin (D) in the total solid content of the photosensitive resin composition is preferably from 5 to 80%, more preferably from 10 to 50%. Within this range, the developability of the photosensitive resin will be good.

The photosensitive resin composition further preferably contains a radical crosslinking agent (C), whereby curing of the photosensitive resin composition by irradiation with light can be accelerated, and curing in a relatively short period of time will be possible.

The radical crosslinking agent (C) has at least two ethylenic double bonds (d) and does not have acidic groups (c). However, the radical crosslinking agent (C) is a compound other than the above resin (A1), (A2) or (A3), and if a resin corresponds to each of the above resin (A1), (A2) or (A3) and the radical crosslinking agent (C), such a resin is regarded as either the resin (A1), (A2) or (A3) in the present invention.

The acidic group (c) and the ethylenic double bond (d) are the same as described with respect to the resin (A1) or the resin (A2).

Specific examples include diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth)acrylate, pentaerythritol tri(meth)acrylate, pentaerythritol tetra(meth)acrylate, ditrimethylolpropane tetra(meth)acrylate, and dipentaerythritol hexa(meth)acrylate. They may be used alone, or two or more of them may be used in combination.

The proportion of the radical crosslinking agent (C) in the total solid content of the photosensitive resin composition is preferably from 5 to 70%, more preferably from 10 to 50%. Within this range, the developability will be good.

In the photosensitive resin composition, it is preferred to use at least one heat curing agent (E) selected from the group consisting of an amino resin, an epoxy compound and an oxazoline compound, whereby it is possible to improve the heat resistance of the coating film cured product.

The amino resin may be a compound having some or all of amino groups of e.g. a melamine compound, a guanamine compound or a urea compound hydroxymethylated, or a compound having some or all of hydroxyl groups of such a hydroxymethylated compound etherified with methanol, ethanol, n-butyl alcohol, 2-methyl-1-propanol or the like, such as hexamethoxymethylmelamine.

The epoxy compound may, for example, be a glycidyl ether such as a bisphenol A type epoxy resin, a bisphenol F type epoxy resin, a phenol/novolak type epoxy resin, a cresol/novolak type epoxy resin, a trisphenolmethane type epoxy resin or a brominated epoxy resin, an alicyclic epoxy resin such as 3,4-epoxycyclohexylmethyl-3,4-epoxycyclohexanecarboxylate or bis(2,3-epoxycyclopentyl) ether, a glycidyl ester such as diglycidyl hexahydrophthalate, diglycidyl tetrahydrophthalate or diglycidyl phthalate, a glycidylamine such as tetraglycidyldiaminodiphenylmethane or triglycidyl p-aminophenol, or a heterocyclic epoxy resin such as triglycidyl isocyanurate.

The oxazoline compound may, for example, be a copolymer of a polymerizable monomer such as 2-vinyl-2-oxazoline, 2-vinyl-4-methyl-2-oxazoline, 2-vinyl-5-methyl-2-oxazoline, 2-isopropenyl-2-oxazoline or 2-isopropenyl-4-methyl-2-oxazoline.

In the photosensitive resin composition, it is preferred to use a silane coupling agent (F), whereby the adhesion of the coating film cured product to the substrate will be improved.

Specific examples of the silane coupling agent (F) include tetraethoxysilane, 3-glycidoxypropyl trimethoxysilane, methyltrimethoxysilane, vinyltrimethoxysilane, 3-methacryloxypropyltrimethoxysilane, 3-chloropropyltrimethoxysilane, 3-mercaptopropyltrimethoxysilane, heptadecafluorooctylethyltrimethoxysilane, and a POA chain-containing triethoxysilane. They may be used alone or two or more of them may be used in combination.

In the photosensitive resin composition, a diluting agent (G) may be used.

Specific examples of the diluting agent (G) include an alcohol such as ethanol, 1-propanol, 2-propanol, 1-butanol or ethylene glycol, a ketone such as acetone, methyl isobutyl ketone or cyclohexanone, a cellosolve such as 2-methoxyethanol, 2-ethoxyethanol or 2-butoxyethanol, a carbitol such as 2-(2-methoxyethoxy)ethanol, 2-(2-ethoxyethoxy)ethanol or 2-(2-butoxyethoxy)ethanol, an ester such as methyl acetate, ethyl acetate, n-butyl acetate, ethyl lactate, n-butyl lactate, ethylene glycol monomethyl ether acetate, propylene glycol monomethyl ether acetate, ethylene glycol diacetate or glycerin triacetate, diethylene glycol dimethyl ether, diethylene glycol methylethyl ether, a chain hydrocarbon such as n-butane or n-hexane, a cyclic saturated hydrocarbon such as cyclohexane, and aromatic hydrocarbon such as toluene, xylene or benzyl alcohol. They may be used alone or two or more of them may be used in combination.

In the photosensitive resin composition of the present invention, a curing accelerator, a coloring agent, a thickener, a plasticizer, a defoaming agent, a leveling agent, a cissing preventive agent or an ultraviolet absorber, may, for example, be used, as the case requires. The coloring agent may, for example, be a dye, an organic pigment, an inorganic pigment or a metallic pigment.

The photosensitive resin composition having the coloring agent incorporated, may be used as a material for forming a light-shielding coating film. For example, as a material for barrier ribs for a color filter, a photosensitive resin composition capable of forming a black coating film may be used in order to increase the contrast of the emitted color of RGB.

The coloring agent for black color is preferably carbon black, titanium black or a black metal oxide pigment. Further, a combination for black color is also preferred wherein at least two organic pigments selected from the group consisting of red, blue, green, purple, yellow, cyan, magenta, etc. are mixed.

The carbon black may, for example, be lamp black, acetylene black, thermal black, channel black or furnace black. The titanium black is one obtained by oxidation of titanium or reduction of titanium dioxide, and is at least one member represented by $Ti_uO_{2u-1}$ (wherein u is a number of at least 1). The black color metal oxide pigment may, for example, be an oxide of copper, iron, chromium, manganese or cobalt. A composite metal oxide made of at least two types selected from the above-mentioned metal oxides, is preferred. For example, an oxide of copper/chromium, an oxide of copper/chromium/manganese, an oxide of copper/iron/manganese, or an oxide of cobalt/iron/manganese, may, for example, be mentioned.

The blue pigment may, for example, be a phthalocyanine pigment; the red pigment may, for example, be a quinacridone pigment, a perylene pigment, a pyrrolopyrrole pigment, or an anthraquinone pigment; the green pigment may, for example, be a halogenated phthalocyanine pigment; the purple pigment may, for example, be dioxazine violet, fast violet B, methyl violet lake or indanthrene brilliant violet; the yellow pigment may, for example, be a tetrachloroisoindolinone pigment, a Hansa yellow pigment, a benzidine yellow pigment, or an azo pigment; the cyan pigment may, for example, be non-metallic phthalocyanine or merocyanine; and the magenta pigment may, for example, be dimethyl quinacridone or thioindigo.

The pigment may be dispersed together with a dispersant (such as a polycaprolactone compound or a long chain alkyl polyamino amide compound) by a dispersing machine such as a sand mill or a roll mill and then added to the photosensitive resin composition. The particle size is preferably at most 1 μm. Within such a range, the developability of the photosensitive resin composition will be good.

Now, a method (photolithography) for forming a pixel pattern by using the photosensitive resin composition will be described.

Firstly, by a conventional method for forming a coating film, a coating film of the photosensitive resin composition is formed on the surface of a substrate.

As the substrate, its material is not particularly limited, but it may, for example, be various types of glass sheets, a polyester such as polyethylene terephthalate, a polyolefin such as polypropylene or polyethylene, a thermoplastic sheet such as polycarbonate, polymethyl methacrylate, polysulfone or polyamide, or a thermosetting plastic sheet such as an epoxy resin, a polyester resin or a poly(meth) acrylic resin. Especially, from the viewpoint of the heat resistance, a glass sheet or a heat resistant plastic such as polyimide is preferably employed.

The method for forming a coating film may, for example, be a spray coating method, a roll coating method, a spin coating method or a bar coating method.

Then, the coating film is dried (hereinafter referred to as prebaking). By the prebaking, the solvent will evaporate, whereby a coating film having no fluidity will be obtained. The conditions for the prebaking vary depending upon the types of the respective components, the blend proportions, etc., but preferably within wide ranges of from 50 to 120° C. for from 10 to 2,000 seconds.

Then, the heated coating film is subjected to exposure via a mask having a prescribed pattern. The light to be used, is preferably electromagnetic waves having a distribution within a range of from 100 to 600 nm and may specifically be, for example, visible light, ultraviolet rays, far ultraviolet rays, a laser beam such as KrF excimer laser, ArF excimer laser or $F_2$ excimer laser. However, if light having a short wavelength is used, the energy is strong, and depending upon the exposure time, the material of the composition at the exposed portion is likely to be decomposed. Accordingly, it is preferably a light having a wavelength of at least ultraviolet ray, and as such a light source, a superhigh pressure mercury lamp which is commonly used for an exposure apparatus, may be mentioned. The exposure is usually carried out within a range of from 5 to 1,000 mJ/cm².

Thereafter, development is carried out by means of a developing solution to remove a non-exposed portion. As the developing solution, an aqueous alkali solution may be used which is made of an alkali such as an inorganic alkali, an amine, an alcoholamine or a quaternary ammonium salt.

The developing time is preferably from 30 to 180 seconds. Further, the developing method may be any method such as a dipping method or a liquid building method. After the development, washing with water is carried out, followed by drying with compressed air or compressed nitrogen to remove moisture on the substrate. Then, heat treatment (hereinafter referred to as post baking treatment) is carried out preferably at a temperature of from 120 to 250° C. for from 5 to 90 minutes by a heating apparatus such as a hotplate or an oven, whereby a pattern will be formed.

After forming barrier ribs for a pixel pattern via the above-mentioned photolithography step, stain on the substrate surface within pixels may sometimes be removed. For example, a step of cleaning the substrate surface by e.g. photoashing treatment or by irradiation by a low pressure mercury lamp or with a short wavelength ultraviolet ray such as excimer UV, may be mentioned. The photoashing treatment is treatment by irradiation with a short wavelength ultraviolet ray in the presence of ozone gas. The short wavelength ultraviolet ray is light having a main peak within a wavelength range of from 100 to 300 nm.

Thus, the photosensitive resin composition of the present invention is alkali-soluble by itself and can be used as a negative resist whereby radicals will be generated from the radical initiator (B) under irradiation with light, and mainly the resin (A1), or the resin (A2) and the resin (A3) and the alkali-soluble photosensitive resin (D), will be crosslinked and cured, and portions not irradiated with light will be removed by alkali development.

The second photosensitive resin composition comprising the resin (A2) and the resin (A3) tends to be superior in ink repellency and ink falling property to the first photosensitive resin composition comprising the resin (A1). The reason is not clearly understood, but is considered to be as follows. The groups (a) and (b) have a nature to align at the coating film surface. However, as compared with the first photosensitive resin composition wherein the groups (a) and (b) are present in the same molecules, the second photosensitive resin composition wherein the groups (a) and (b) are present in separate molecules, has a higher degree of freedom of molecular chains, whereby the groups (a) and (b) are considered to more readily align at the surface.

The second photosensitive resin composition comprising the resin (A2) and the resin (A3) tends to be superior in ink repellency of the coating film cured product after UV irradiation to the first photosensitive resin composition comprising the resin (A1). The reason is not clearly understood, but is considered to be as follows. To suppress deterioration of the groups (a) of the formula 1 by UV irradiation, it is preferred that the groups (b) of the formula 2 which are excellent in resistance against UV irradiation are present in the vicinity of the groups (a) at the surface of the coating film. As compared with the first photosensitive resin composition wherein the groups (a) and (b) are present in the same molecules, the second photosensitive resin composition wherein the groups (a) and (b) are present in separate molecules, has a higher degree of freedom of molecular chains, whereby alignment at the coating film surface is considered to be in a more preferred state.

From the viewpoint of the degree of freedom of molecular chains, alignment at the coating film surface is considered to be in a more preferred state, and accordingly, it is a preferred embodiment that the first photosensitive resin composition comprising the resin (A1) further contains the resin (A2), or the first photosensitive resin composition comprising the resin (A1) further contains the resin (A3).

The ink repellency can be estimated by the contact angles of water and xylene. Namely, the contact angle of water is preferably at least 80°, more preferably at least 90°, particularly preferably at least 100°. Whereas, the contact angle of xylene is preferably at least 30°, more preferably at least 35°, particularly preferably at least 40°.

The ink falling property can be estimated by the falling angles of water and xylene. Namely, the falling angle of water is preferably at most 35°, more preferably at most 25°. Whereas, the falling angle of xylene is preferably at most 30°, more preferably at most 20°.

Further, the above-mentioned photosensitive resin compositions of the present invention have excellent alkali solubility and developability and thus are capable of forming fine patterns. Specifically, they may be preferably used for forming patterns of at most 100 μm, more preferably used for forming patterns of at most 50 μm.

Now, the present invention will be described in further detail with reference to Preparation Examples and working Examples, but it should be understood that the present invention is by no means thereby restricted. Examples 1 to 10 are Examples of the present invention, and Examples 11 to 13 are Comparative Examples. In the following, "parts" and "%" are based on mass, unless otherwise specified. Further, the number average molecular weight is a value measured by using polystyrene as a standard substance by a gel permeation chromatography method.

Abbreviated symbols for compounds used in each Example are shown below.

C4FMA: $CH_2=C(CH_3)COOCH_2CH_2(CF_2)_4F$
C6FMA: $CH_2=C(CH_3)COOCH_2CH_2(CF_2)_6F$
C8FA: $CH_2=CHCOOCH_2CH_2(CF_2)_8F$
X-174DX: Dimethylsilicone chain-containing methacrylate (tradename: X-22-174DX, manufactured by Shin-Etsu Chemical Co., Ltd.)
X-8201: Dimethylsilicone chain-containing methacrylate (tradename: X-24-8201, manufactured by Shin-Etsu Chemical Co., Ltd.)
MAA: Methacrylic acid
AA: Acrylic acid
2-HEMA: 2-Hydroxyethyl methacrylate
N-MAA: N-Hydroxymethylacrylamide
MMA: Methyl methacrylate
CHMA: Cyclohexyl methacrylate
IBMA: Isobonyl methacrylate
BMA: n-Butyl methacrylate
V-70: 2,2'-Azobis(4-methoxy-2,4-dimethylvaleronitrile) (tradename: V-70, manufactured Wako Pure Chemical Industries, Ltd.)
DSH: n-Dodecylmercaptan
2-ME: 2-Mercaptoethanol
MOI: 2-Methacyloyloxyethyl isocyanate
DBTDL: Dibutyltin dilaurate
BHT: 2,6-Di-t-butyl-p-cresol
AC: Acryloyl chloride
TEA: Triethylamine
ECA: 3,4-Epoxycyclohexylmethyl acrylate
MIBK: Methyl isobutyl ketone
CCR-1115: Cresol novolak resin (tradename: CCR-1115, manufactured by Nippon Kayaku Co., Ltd., solid content 60%, number of ethylenic double bonds per molecule: about 10)
CYCLOMER P: Photosensitive resin (CYCLOMER P(ACA)250, manufactured by Daicel Chemical Industries, Ltd., solid content: 46%)
IR907: Radical initiator (tradename: IRGACURE-907, manufactured by Ciba Geigy)
IR369: Radical initiator (tradename: IRGACURE-369, manufactured by Ciba Geigy)
DEAB: 4,4'-Bis(diethylamino)benzophenone
ITX: Isopropylthioxanthone (tradename: Quantacure ITX, manufactured by Ward Blenkinsop, Ltd)
DETX-S: Isopropylthioxanthone (tradename: DETX-S, manufactured by Nippon Kayaku Co., Ltd.)
D310: Dipentaerythritol pentaacrylate (tradename: KAYARAD D-310, manufactured by Nippon Kayaku Co., Ltd.)
M325: Methyletherified melamine resin (tradename: Cymel 325, manufactured by Mitsui Cyanamid)
NW-100LM: Methyletherified melamine resin (tradename: NIKALAC NW-100LM, manufactured by Sanwa Chemical Co., Ltd.)
157S65: Bisphenol A novolak type (tradename: Epikote 157S65, manufactured by Japan Epoxy Resins Co., Ltd.)

KBM403: 3-Glycidoxypropyltrimethoxysilane (tradename: KBM-403, manufactured by Shin-Etsu Chemical Co., Ltd.)
DEGDM: Diethylene glycol dimethyl ether
CB: Carbon black (average particle size: 120 nm, propylene glycol monomethyl ether acetate solution, solid content: 20%)

Preparation of Resin (A1), Resin (A2), Resin (A3), and Photosensitive Resin (D1)

PREPARATION EXAMPLE 1

Into an autoclave having an internal capacity of 1 L and equipped with a stirrer, 555.0 g of acetone, 24.0 g of C8FA, 96.0 g of X-8201, 48.0 g of MAA, 72.0 g of IBMA, 9.7 g of chain transfer agent DSH and 3.0 g of polymerization initiator V-70 were charged and polymerized at 40° C. for 18 hours with stirring in a nitrogen atmosphere to obtain a solution of a polymer. The number average molecular weight of the polymer was 5,000. Water was added to the obtained acetone solution of the polymer for reprecipitation and purification. Then, with petroleum ether, reprecipitation and purification were carried out, followed by vacuum drying to obtain 240 g of a polymer.

Into a glass flask having an internal capacity of 300 mL and equipped with a thermometer, a stirrer and a heating device, 100 g of the polymer, 21.2 g of ECA and 100 g of methyl isobutyl ketone were charged and polymerized at 50° C. for 48 hours with stirring to obtain a solution of resin (A1-1). The number average molecular weight of the resin (A1-1) was 7,000. Water was added to the obtained acetone solution of resin (A1-1) for reprecipitation and purification. Then, with petroleum ether, reprecipitation and purification were carried out, followed by vacuum drying to obtain 120 g of resin (A1-1).

PREPARATION EXAMPLE 2

In the same manner as for resin (A1-1), a polymer was obtained by the same polymerization reaction except that the blend composition of raw materials was changed as shown in Table 1.

Into a glass flask having an internal capacity of 300 mL and equipped with a thermometer, a stirrer and a heating device, 100 g of the polymer, 41.7 g of MOI, 0.17 g of DBTDL, 2.1 g of BHT and 100 g of acetone were charged and polymerized at 30° C. for 18 hours with stirring to obtain a solution of resin (A1-2). The number average molecular weight of the resin (A1-2) was 9,800. Water was added to the obtained acetone solution of resin (A1-2) for reprecipitation and purification. Then, with petroleum ether, reprecipitation and purification were carried out, followed by vacuum drying to obtain 140 g of resin (A1-2).

PREPARATION EXAMPLE 3

In the same manner as for resin (A1-1), a polymer was obtained by the same polymerization reaction except that the blend composition of raw materials was changed as shown in Table 1.

Into a glass flask having an internal capacity of 300 mL and equipped with a thermometer, a stirrer and a heating device, 100 g of the polymer, 17.9 g of AC, 20.0 g of TEA and 100 g of acetone were charged and polymerized at 30° C. for 18 hours with stirring to obtain a solution of resin (A1-3). The number average molecular weight of the resin (A1-3) was 9,400. Water was added to the obtained acetone solution of resin (A1-3) for reprecipitation and purification, followed by washing with a 1% aqueous solution of hydrochloric acid. Then, with petroleum ether, reprecipitation and purification were carried out, followed by vacuum drying to obtain 110 g of resin (A1-3).

PREPARATION EXAMPLES 4 TO 14

In the same manner as for resin (A1-1), polymers were obtained by the same polymerization reaction except that the blend compositions of raw materials were changed as shown in Tables 1 and 2.

In the same manner as for resins (A1-1) to (A1-3), resins (A1-4), (A1-5), (A2-1) to (A2-4), (A3-1) to (A3-3), (D1-1) and (D1-2) were obtained by the same modification reaction except that the blend compositions of raw materials were changed as shown in Tables 1 and 2.

Further, in Tables 1 and 2, the content of fluorine atoms, the content of silicon atoms, the number of ethylenic double bonds per molecule and the theoretical value of acid value of each resin, as calculated from the blend amounts of raw materials, are shown.

Evaluation of Photosensitive Resin Compositions

In the proportions as shown in Tables 3 and 4, resins (A1), resin (A2), resin (A3), radical initiator (B), photosensitive resin (D), radical crosslinking agent (C), heat crosslinking agent (E), silane coupling agent (F), diluting agent (H) and optional other components, were blended to obtain photosensitive resin compositions of Examples 1 to 13.

A photosensitive resin composition was applied on a glass substrate by means of a spinner and then prebaked on a hot plate at 100° C. for 2 minutes to form a coating film having a thickness of 3.0 μm. Then, a mask (line/space=20 μm/20 μm) was contacted to the coating film, followed by irradiation with 150 mJ/cm$^2$ by an ultrahigh pressure mercury lamp. Then, a non-exposed portion was dipped in a 0.1% tetramethylammoniumhydroxy aqueous solution for 40 seconds, and the non-exposed portion was washed off with water, followed by drying. Then, heating was carried out at 220° C. for 1 hour on a hot plate to obtain a glass substrate having a pattern formed thereon. With respect to this substrate, the developability, the adhesion to the substrate, the ink repellency, the durability of the ink repellency, the ink repellency after UV irradiation, the ink falling property, the durability of the ink falling property, and the ink falling property after UV irradiation, were measured and evaluated by the following methods.

Developability:

Symbol ○ indicates a case where a pattern of line/space was formed, and symbol X indicates a case where no such a pattern was formed.

Adhesion to the Substrate:

The adhesion was evaluated by the cross-cut tape method as disclosed in JIS K5400. The coating film was cross-cut by a cutter in a distance of 2 mm to have 25 sections. Then, an adhesive tape was bonded and peeled, whereupon the adhesion state of the coating film was visually evaluated. Symbol ○ indicates a case where no sections were peeled, and symbol X indicates a case where almost all sections were peeled.

Ink Repellency:

The ink repellency was evaluated by the contact angles (degrees) of water and xylene on the surface of a coating film cured product formed on a glass substrate. The contact angle is an angle between the tangent line against the liquid surface and the solid surface at a point where the solid and the liquid are in contact and represented by the angle on the side including the liquid. The larger the angle, the better the ink repellency of the coating film. The contact angle of water being at least 80° is represented by symbol ○, and less than 80° is represented by symbol X. Likewise, the contact angle of xylene being at least 30° is represented by symbol ○, and less than 30° is represented by symbol X.

Durabiltiy of the Ink Repellency:

It was evaluated by the contact angles of water and xylene after the coating film cured product formed on a glass substrate was rubbed ten times with a gauze having xylene impregnated.

Ink Repellency after UV Irradiation:

It was evaluated by the contact angles of water and xylene after irradiation with UV for 2 minutes using a low pressure mercury lamp as a light source.

Ink Falling Property

For the ink falling property, 50 μL of water or 10 μL of xylene was dropped on the surface of a coating film cured product formed on a glass substrate held horizontally, and one side of the glass substrate was raised so that it was gradually inclined, whereby the angle between the glass substrate surface and the horizontal plane at the time when a water drop or a xylene drop started to fall was taken as a falling angle (degrees). The smaller the angle, the better the ink falling property of the coating film. The falling angle of water being at most 35° is represented by symbol ○, and more than 35° is represented by symbol X. Likewise, the falling angle of xylene being at most 30° is represented by symbol ○, and more than 30° is represented by symbol X.

Durabiltiy of the Ink Falling Property:

It was evaluated by the falling angles of water and xylene after the coating film cured product formed on a glass substrate was gently rubbed ten times with a gauze having xylene impregnated.

Ink Falling Property after UV Irradiation

It was evaluated by the falling angles of water and xylene after irradiation with UV for 2 minutes using a low pressure mercury lamp as a light source.

TABLE 1

| Preparation Example | 1 | 2 | 3 | 4 | 5 | 6 | 7 |
|---|---|---|---|---|---|---|---|
| Resin [Polymerization reaction] (g) | A1-1 | A1-2 | A1-3 | A1-4 | A1-5 | A2-1 | A2-2 |
| C4FMA | | 72.0 | | | | | |
| C6FMA | | | 48.0 | | | | 96.0 |
| C8FA | 24.0 | | | 48.0 | 88.0 | 72.0 | |
| X-174DX | | | 108.0 | | 8.0 | | |
| X-8201 | 96.0 | 72.0 | | 96.0 | | | |
| MAA | 48.0 | 12.0 | 12.0 | 24.0 | 72.0 | 36.0 | 24.0 |
| AA | | | | | | | |
| 2-HEMA | | 84.0 | | 72.0 | 72.0 | 96.0 | 96.0 |
| N-MAA | | | 48.0 | | | | |
| MMA | | | | | | 36.0 | |
| CHMA | | | | | | | 24.0 |
| IBMA | 72.0 | | 24.0 | | | | |
| BMA | | | | | | | |
| V-70 | 3.0 | 3.2 | 2.7 | 3.0 | 5.0 | 5.1 | 4.3 |
| DSH | 9.7 | 6.9 | 5.7 | 6.9 | 9.7 | | |
| 2-ME | | | | | | 3.1 | 3.8 |
| Acetone | 555.0 | 555.0 | 555.0 | 555.0 | 555.0 | 554.9 | 555.7 |
| [Modification reaction] (g) | | | | | | | |
| Polymer | 100 | 100 | 100 | 100 | 100 | 100 | 100 |
| MOI | | 41.7 | | 35.8 | 36.2 | 47.7 | 47.7 |
| DBTDL | | 0.17 | | 0.14 | 0.15 | 0.19 | 0.19 |
| BHT | | 2.1 | | 1.8 | 1.8 | 2.4 | 2.4 |
| AC | | | 17.9 | | | | |
| TEA | | | 20.0 | | | | |
| ECA | 21.2 | | | | | | |
| Acetone | | 100 | 100 | 100 | 100 | 100 | 100 |
| MIBK | 100 | | | | | | |
| Yield (g) | 120 | 140 | 110 | 135 | 135 | 146 | 145 |
| Molecular weight | 7000 | 9800 | 9400 | 9500 | 7500 | 8860 | 7390 |
| Content of F atoms (%) | 5.1 | 10.9 | 10.3 | 9.2 | 14.6 | 12.7 | 15.5 |
| Content of Si atoms (%) | 12.1 | 7.8 | 15.2 | 10.8 | 0.8 | — | — |
| Number of C=C per molecule | 5.8 | 16.8 | 16.2 | 18.8 | 11.5 | 18.5 | 15.4 |
| Acid value (mgKOH/g) | 54 | 22 | 38 | 48 | 119 | 66.3 | 44.2 |

TABLE 2

| Preparation Example | 8 | 9 | 10 | 11 | 12 | 13 | 14 |
|---|---|---|---|---|---|---|---|
| Resin | A2-3 | A2-4 | A3-1 | A3-2 | A3-3 | D1-1 | D1-2 |
| [Polymerization reaction] (g) | | | | | | | |
| C4FMA | 120.0 | | | | | | |
| C6FMA | | 96.0 | | | | | |
| C8FA | | | | | | | |
| X-174DX | | | 12.0 | | 24.0 | | |
| X-8201 | | | | 24.0 | | | |
| MAA | 12.0 | | 24.0 | 12.0 | | | |
| AA | | 72.0 | | | 72.0 | 55.0 | 26.0 |
| 2-HEMA | 96.0 | | 132.0 | 132.0 | | 101.0 | 137.0 |
| N-MAA | | | | | | | |
| MMA | | | 72.0 | | 144.0 | | |
| CHMA | | | | | | | 77.0 |
| IBMA | 12.0 | 72.0 | | 72.0 | | 84.0 | |
| BMA | | | | | | | |
| V-70 | 4.0 | 4.8 | 6.2 | 4.6 | 7.6 | 6.0 | 5.8 |
| DSH | | | | | | 9.7 | 9.7 |
| 2-ME | 4.7 | 3.8 | 2.7 | 2.7 | 2.7 | | |
| Acetone | 556.0 | 555.2 | 553.8 | 555.4 | 552.4 | 555.0 | 555.0 |
| [Modification reaction] (g) | | | | | | | |
| Polymer | 100 | 100 | 100 | 100 | 100 | 100 | 100 |
| MOI | | 65.6 | | | | 50.1 | |
| DBTDL | | 0.26 | | | | 0.20 | |
| BHT | | 3.3 | | | | 2.5 | |
| AC | 27.8 | | 38.3 | | | | 39.7 |
| TEA | 31.1 | | 42.8 | | | | 44.4 |
| ECA | | 51.3 | | 51.3 | | | |
| Acetone | 100 | | 100 | 100 | | 100 | 100 |
| MIBK | | 100 | | | 100 | | |
| Yield (g) | 116 | 150 | 165 | 122 | 150 | 148 | 124 |
| Molecular weight | 4670 | 7570 | 11590 | 8600 | 10590 | 7300 | 6100 |
| Content of F atoms (%) | 22.1 | 15.1 | — | — | — | — | — |
| Content of Si atoms (%) | — | — | 1.1 | 3.0 | 2.5 | — | — |
| Number of C=C per molecule | 12.3 | 14.1 | 29.6 | 29.6 | 19.7 | 16.2 | 21.9 |
| Acid value (mgKOH/g) | 54.0 | 52.0 | 39.4 | 72.0 | 52.0 | 118 | 80 |

TABLE 3

| | Ex. 1 | Ex. 2 | Ex. 3 | Ex. 4 | Ex. 5 | Ex. 6 |
|---|---|---|---|---|---|---|
| Resin (A1) | | | | | | |
| Resin A1-1 | 2.5 | | | | 0.08 | |
| Resin A1-2 | | 24.7 | | | | |
| Resin A1-3 | | | 2.5 | | | |
| Resin A1-4 | | | | 2.5 | | |
| Resin A1-5 | | | | | | 2.2 |
| Radical initiator (B) | | | | | | |
| IR907 | 3.0 | 3.0 | 3.0 | 3.0 | 3.0 | 2.2 |
| DEAB | 1.2 | 1.1 | 1.2 | | 1.1 | 0.9 |
| ITX | | | | 1.2 | | |
| Photosensitive resin (D) | | | | | | |
| Resin D1-1 | 42.1 | 16.5 | | | 41.1 | |
| Resin D1-2 | | | 42.1 | | | |
| CCR1115 | | | | 70.2 | | |
| CYCLOMER P | | | | | | 23.3 |
| Radical crosslinking agent (C) | | | | | | |
| D310 | 42.1 | 41.1 | 42.1 | 42.1 | 41.1 | 10.8 |
| Heat crosslinking agent (E) | | | | | | |
| M325 | 4.9 | 9.5 | 4.9 | 4.9 | 9.5 | |
| Silane coupling agent (F) | | | | | | |
| KBM403 | 4.2 | 4.1 | 4.2 | 4.2 | 4.1 | 1.1 |
| Diluting agent (G) | | | | | | |
| DEGDM | 200 | 200 | 200 | 200 | 200 | 51 |
| Other | | | | | | |
| CE | | | | | | 8.7 |
| Solid content of resin (A1) (%) | 2.5 | 24.5 | 2.5 | 2.5 | 0.08 | 7.4 |
| Developability | ○ | ○ | ○ | ○ | ○ | ○ |
| Adhesion to the substrate | ○ | ○ | ○ | ○ | ○ | ○ |
| Ink repellency | ○/○ | ○/○ | ○/○ | ○/○ | ○/○ | ○/○ |
| Durability of ink repellency | ○/○ | ○/○ | ○/○ | ○/○ | ○/○ | ○/○ |

TABLE 3-continued

|  | Ex. 1 | Ex. 2 | Ex. 3 | Ex. 4 | Ex. 5 | Ex. 6 |
|---|---|---|---|---|---|---|
| Ink repellency after UV irradiation | ○/○ | ○/○ | ○/○ | ○/○ | ○/○ | ○/○ |
| Ink falling property | ○/○ | ○/○ | ○/○ | ○/○ | ○/○ | ○/○ |
| Durability of ink falling property | ○/○ | ○/○ | ○/○ | ○/○ | ○/○ | ○/○ |
| Ink falling property after UV irradiation | ○/○ | ○/○ | ○/○ | ○/○ | ○/○ | ○/○ |

In Tables 3 and 4, the ink repellency and the ink falling property represent evaluation of water/xylene.

TABLE 4

|  | Ex. 7 | Ex. 8 | Ex. 9 | Ex. 10 | Ex. 11 | Ex. 12 | Ex. 13 |
|---|---|---|---|---|---|---|---|
| Resin (A2) | | | | | | | |
| Resin A2-1 | 2.0 | | | | | | 2.0 |
| Resin A2-2 | | 10.0 | | | | | |
| Resin A2-3 | | | 2.0 | | | | |
| Resin A2-4 | | | | 2.0 | | | |
| Resin (A3) | | | | | | | |
| Resin A3-1 | 5.0 | 5.0 | | | | 5.0 | |
| Resin A3-2 | | | 15.0 | | | | |
| Resin A3-3 | | | | 5.0 | | | |
| Photosensitive resin (D) | | | | | | | |
| Resin D1-1 | 100 | | | | | | |
| CCR1115 | | 167 | 167 | 167 | 100 | 100 | 100 |
| Radical initiator (B) | | | | | | | |
| IR907 | 12.0 | 12.0 | 12.0 | | 12.0 | 12.0 | 12.0 |
| IR369 | | | | 20.0 | | | |
| DEAB | 6.0 | 6.0 | 6.0 | | 6.0 | 6.0 | 6.0 |
| DETX-S | | | | 10.0 | | | |
| Radical crosslinking agent (C) | | | | | | | |
| D310 | 100 | 100 | 100 | 100 | 100 | 100 | 100 |
| Heat crosslinking agent (E) | | | | | | | |
| NW-100LM | 35.0 | | | | | | |
| 157S65 | | 26.0 | 26.0 | 26.0 | 26.0 | 26.0 | 26.0 |
| Silane coupling agent (F) | | | | | | | |
| KBM403 | 10.0 | 10.0 | 10.0 | 10.0 | 10.0 | 10.0 | 10.0 |
| Diluting agent (G) | | | | | | | |
| DEGDM | 400 | 400 | 400 | 320 | 400 | 400 | 400 |
| Other | | | | | | | |
| CB | | | | 100 | | | |
| Solid content of resin (A2) (%) | 0.74 | 3.72 | 0.74 | 0.57 | 0 | 0 | 0.78 |
| Solid content of resin (A3) (%) | 1.85 | 1.86 | 5.54 | 1.34 | 0 | 1.93 | 0 |
| Developability | ○ | ○ | ○ | ○ | ○ | ○ | ○ |
| Adhesion to the substrate | ○ | ○ | ○ | ○ | ○ | ○ | ○ |
| Ink repellency | ○/○ | ○/○ | ○/○ | ○/○ | X/X | ○/X | ○/○ |
| Durability of ink repellency | ○/○ | ○/○ | ○/○ | ○/○ | X/X | ○/X | ○/○ |
| Ink repellency after UV irradiation | ○/○ | ○/○ | ○/○ | ○/○ | X/X | ○/X | X/X |
| Ink falling property | ○/○ | ○/○ | ○/○ | ○/○ | X/X | ○/○ | X/○ |
| Durability of ink falling property | ○/○ | ○/○ | ○/○ | ○/○ | X/X | ○/○ | X/○ |
| Ink falling property after UV irradiation | ○/○ | ○/○ | ○/○ | ○/○ | X/X | ○/○ | X/○ |

INDUSTRIAL APPLICABILITY

The photosensitive resin composition of the present invention is useful for applications where ink repellency is required. For example, it is suitably employed for forming barrier ribs for e.g. color filters for liquid crystal displays or organic EL displays, or for forming barrier ribs for forming wiring patterns in semiconductor devices or electric circuits.

The entire disclosures of Japanese Patent Application No. 2003-061813 filed on Mar. 7, 2003 and Japanese Patent Application No. 2003-385222 filed on Nov. 14, 2003 including specifications, claims and summaries are incorporated herein by reference in their entireties.

What is claimed is:

1. A photosensitive resin composition comprising a resin (A1), a radical initiator (B) and an alkali-soluble photosensitive resin (D), wherein the resin (A1) and the alkali-soluble photosensitive resin (D) are as follows:
    the resin (A1) has groups (a) of the following formula 1, groups (b) of the following formula 2 and ethylenic double bonds (d):

$$—CFXR^f \qquad \text{Formula 1}$$

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom))

$$—(SiR^1R^2—O)_n—SiR^1R^2R^3 \qquad \text{Formula 2}$$

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200);
    the alkali-soluble photosensitive resin (D) has acidic groups (c) and at least three ethylenic double bonds (d) per molecule, and does not have groups (a) of the above formula 1 or groups (b) of the above formula 2.

2. The photosensitive resin composition according to claim 1, wherein the fluorine atom content in the resin (A1) is from 1 to 30%, and the proportion of the resin (A1) in the total solid content in the photosensitive resin composition is from 0.01 to 50%.

3. The photosensitive resin composition according to claim 1, wherein the silicon atom content in the resin (A1) is from 0.1 to 25%.

4. The photosensitive resin composition according to claim 1, wherein the resin (A1) further has acidic groups (c).

5. The photosensitive resin composition according to claim 1, which further contains a radical crosslinking agent (C), wherein the radical crosslinking agent (C) has at least two ethylenic double bonds (d) and does not have acidic groups (c).

6. The photosensitive resin composition according to claim 1, which further contains at least one heat curing agent (E) selected from the group consisting of an amino resin, an epoxy compound and an oxazoline compound.

7. A coating film cured product obtained from the photosensitive resin composition as defined in claim 1.

8. A photosensitive resin composition comprising a resin (A2), a resin (A3), a radical initiator (B) and an alkali-soluble photosensitive resin (D), wherein the resin (A2), the resin (A3) and the alkali-soluble photosensitive resin (D) are as follows:
    the resin (A2) has groups (a) of the following formula 1 and ethylenic double bonds (d) and does not have groups (b) of the following formula 2;
    the resin (A3) has groups (b) of the following formula 2 and ethylenic double bonds (d) and does not have groups (a) of the following formula 1:

$$—CFXR^f \qquad \text{Formula 1}$$

(wherein X is a hydrogen atom, a fluorine atom or a trifluoromethyl group, and $R^f$ is a fluorine atom, or an alkyl group having at most 20 carbon atoms wherein at least one of hydrogen atoms is substituted by a fluorine atom (provided that the above alkyl group includes one having an etheric oxygen atom))

$$—(SiR^1R^2—O)_n—SiR^1R^2R^3 \qquad \text{Formula 2}$$

(wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200);
    the alkali-soluble photosensitive resin (D) has acidic groups (c) and at least three ethylenic double bonds (d) per molecule and does not have groups (a) of the above formula 1 or groups (b) of the above formula 2.

9. The photosensitive resin composition according to claim 8, wherein the fluorine atom content in the resin (A2) is from 5 to 30%, and the proportion of the resin (A2) in the total solid content in the photosensitive resin composition is from 0.01 to 20%.

10. The photosensitive resin composition according to claim 9, wherein the silicon atom content in the resin (A3) is from 0.1 to 30%, and the proportion of the resin (A3) in the total solid content in the photosensitive resin composition is from 0.01 to 20%.

11. The photosensitive resin composition according to claim 8, wherein the resin (A2) further has acidic groups (c).

12. The photosensitive resin composition according to claim 8, wherein the resin (A3) further has acidic groups (c).

13. The photosensitive resin composition according to claim 8, which further contains a radical crosslinking agent (C), wherein the radical crosslinking agent (C) has at least two ethylenic double bonds (d) and does not have acidic groups (c).

14. The photosensitive resin composition according to claim 8, which further contains at least one heat curing agent (E) selected from the group consisting of an amino resin, an epoxy compound and an oxazoline compound.

15. A coating film cured product obtained from the photosensitive resin composition as defined in claim 8.

* * * * *